United States Patent
Baik et al.

(10) Patent No.: US 10,069,024 B2
(45) Date of Patent: Sep. 4, 2018

(54) PHOTOCONDUCTIVE ANTENNA

(71) Applicant: SAMSUNG ELECTRONICS CO., LTD., Suwon-si (KR)

(72) Inventors: Chanwook Baik, Yongin-si (KR); Jisoo Kyoung, Seoul (KR); Sangmo Cheon, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/538,560

(22) Filed: Nov. 11, 2014

(65) Prior Publication Data

US 2015/0194542 A1 Jul. 9, 2015

(30) Foreign Application Priority Data

Jan. 3, 2014 (KR) .................. 10-2014-0000835

(51) Int. Cl.
| | |
|---|---|
| *H01L 31/0232* | (2014.01) |
| *H01L 31/0304* | (2006.01) |
| *H01L 31/08* | (2006.01) |
| *H01L 31/09* | (2006.01) |
| *G02B 5/18* | (2006.01) |

(52) U.S. Cl.
CPC .... *H01L 31/0304* (2013.01); *H01L 31/02327* (2013.01); *H01L 31/085* (2013.01); *H01L 31/09* (2013.01); *G02B 5/1876* (2013.01); *Y02E 10/544* (2013.01)

(58) Field of Classification Search
CPC .... G02B 5/1876; G02B 5/1861; G02B 5/188; H01L 31/0232; H01L 31/02327; H01L 31/0547; H01L 31/16; H01L 31/09
USPC .................................... 257/98, 432
See application file for complete search history.

(56) References Cited

U.S. PATENT DOCUMENTS

| | | | |
|---|---|---|---|
| 5,317,551 A * | 5/1994 | Shiono | G02B 5/1876 359/571 |
| 7,087,902 B2 | 8/2006 | Wang et al. | |
| 8,119,989 B2 | 2/2012 | Jin et al. | |
| 2010/0091266 A1* | 4/2010 | Yasuda | G01N 21/552 356/51 |
| 2012/0086096 A1* | 4/2012 | Paek | G01J 3/0208 257/432 |
| 2012/0112230 A1* | 5/2012 | Jun | H01Q 19/062 257/98 |

(Continued)

FOREIGN PATENT DOCUMENTS

| | | |
|---|---|---|
| DE | 102006037470 A1 | 2/2008 |
| JP | 4894610 B2 | 3/2012 |
| JP | 2013-76618 A | 4/2013 |

(Continued)

OTHER PUBLICATIONS

Mikael Karlsson et al., "Transfer of micro-optical structures into GaAs by use of inductively coupled plasma dry etching", Applied Optics, vol. 41, No. 5, Feb. 10, 2002, pp. 902-908.

*Primary Examiner* — David Spalla
(74) *Attorney, Agent, or Firm* — Sughrue Mion, PLLC

(57) ABSTRACT

A PCA is provided including: a semiconductor substrate; a metallic antenna, formed on one surface of the semiconductor substrate; and a first pattern structure, formed on the same surface of the semiconductor substrate as the surface on which the metallic antenna is formed, to obstruct surface waves and/or back-scattered waves.

13 Claims, 16 Drawing Sheets

(56) References Cited

U.S. PATENT DOCUMENTS

2012/0127568 A1    5/2012  Schonbrun et al.
2013/0181128 A1*   7/2013  Takenaka ............ H01L 33/0004
                                                        250/330

FOREIGN PATENT DOCUMENTS

KR      20100063603  A  *  6/2010
KR      10-1037629   B1    5/2011

* cited by examiner

PHOTOCONDUCTIVE ANTENNA

CROSS REFERENCE TO RELATED APPLICATION

This application claims priority from Korean Patent Application No. 10-2014-0000835, filed on Jan. 3, 2014, in the Korean Intellectual Property Office, the disclosure of which is incorporated herein in its entirety by reference.

BACKGROUND

1. Field

Apparatuses consistent with exemplary embodiments relate to photoconductive antennas, and more particularly, to photoconductive antennas capable of reducing electromagnetic wave loss.

2. Description of the Related Art

A terahertz frequency band between a micro frequency band and an optical frequency band is a very meaningful frequency band in the fields of molecular optics, biophysics, medical, spectroscopy, imaging, and security. That is, electromagnetic waves of the terahertz frequency band have a difference in absorption characteristics according to properties of materials and have both the directivity of light and the permeability of electronic waves, and thus according to the use of the above features of the terahertz frequency band, the terahertz frequency band may be applied to fields of material analysis, security, medical scanning, and the like.

A photoconductive antenna (PCA) may be used for emission and detection of terahertz (or sub-millimeter) electromagnetic waves. For example, a terahertz PCA may have a structure having a dipole antenna pattern formed on a III-V-group semiconductor substrate formed of gallium arsenide (GaAs) or the like. When an ultrashort pulse laser beam is incident on the dipole antenna pattern, carriers, such as electrons, are excited on the dipole antenna pattern, and the electrons move by an electric field between the two electrodes of the antenna. Electrons generated due to the ultrashort pulses are very quickly generated and extinguished in the substrate, and this phenomenon mainly occurs in a frequency band of about 0.3 THz to about 3 THz. Generated electromagnetic waves pass through the substrate in a vertical direction and are propagated to the air.

According to the photoconductive principle, when a laser beam having greater energy than band-gap energy of a semiconductor substrate is incident on the substrate, electrons are excited to a conductive band and return to a stable state again, and this energy difference, which corresponds to electromagnetic wave energy of a terahertz frequency band in millimeter waves, is called a terahertz photoconductive effect.

In a general PCA, electromagnetic waves emitted from an antenna pattern may travel as surface waves, thereby causing loss, and in addition, electromagnetic waves, which have returned by being reflected from a surface of the substrate opposite the surface on which the antenna pattern is formed, may be refracted by the surface on which the antenna pattern is formed and may be emitted to the outside, thereby causing loss.

SUMMARY

One or more exemplary embodiments may provide photoconductive antennas capable of reducing electromagnetic wave loss.

Additional exemplary aspects will be set forth in part in the description which follows and, in part, will be apparent from the description, or may be learned by practice of the presented exemplary embodiments.

According to an aspect of an exemplary embodiment, a photoconductive antenna (PCA) includes: a semiconductor substrate; a metallic antenna, formed on one surface of the semiconductor substrate; and a first pattern structure, formed on the same surface of the semiconductor substrate as the surface on which the metallic antenna is formed, to obstruct surface waves and/or back-scattered waves.

The first pattern structure may be a Fresnel lens or Fresnel zone plate.

The first pattern structure may function as a negative Fresnel lens.

The PCA may further include a second pattern structure formed on a second surface of the semiconductor substrate, opposite the surface on which the metallic antenna is formed, to condense or disperse electromagnetic waves.

The second pattern structure may be a Fresnel lens or Fresnel zone plate shape.

The second pattern structure may function as a positive Fresnel lens.

A cross-sectional shape of the first pattern structure may be a repetitive pattern of rectangles, triangles, inverse triangles, or trapezoids.

The PCA may further include a second pattern structure formed on the surface of the semiconductor substrate opposite the surface on which the first pattern structure is formed to condense or disperse electromagnetic waves.

At least one of the first pattern structure and the second pattern structure may be patterned on the semiconductor substrate by a lithography process or may be separately produced and assembled with the semiconductor substrate.

An array of multiple groups, each group comprising the first pattern structure, the metallic antenna and the second pattern structure, may be arranged on the semiconductor substrate.

An array of multiple groups, each group comprising the first pattern structure and the metallic antenna, may be arranged on the semiconductor substrate.

The semiconductor substrate may include a III-V-group semiconductor material.

The semiconductor substrate may include gallium arsenide (GaAs), gallium phosphide (GaP), or indium phosphide (InP).

The metallic antenna may be an electromagnetic wave antenna using a photoconductive effect.

The metallic antenna may operate by dipole or multi-pole electrodes.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
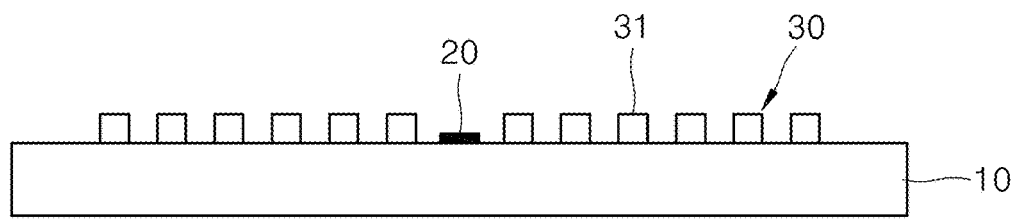
FIG. 1 illustrates a photoconductive antenna (PCA) according to an exemplary embodiment.

Hereinafter, photoconductive antennas (PCAs) according to exemplary embodiments will be described in detail with reference to the accompanying drawings. In the drawings, like reference numerals refer to like elements, and the sizes and thicknesses of components may be exaggerated for convenience of description. In this regard, the described embodiments may have different forms and should not be construed as being limited to the descriptions set forth herein. Accordingly, the exemplary embodiments are merely described below, by referring to the figures. Hereinafter, when it is described that one layer is provided "on", "above", or on an upper part of" a substrate or another layer, the layer may be located on another layer directly or via another layer in the middle. As used herein, expressions such as "at least one of," when preceding a list of elements, modify the entire list of elements and do not modify the individual elements of the list.

A PCA according to an exemplary embodiment includes a semiconductor substrate, a metallic antenna formed on one surface of the semiconductor substrate, and a first pattern structure formed on the same surface of the semiconductor substrate as the metallic antenna to obstruct surface waves and/or back-scattered waves. The PCA according to an exemplary embodiment of the present invention may further include a second pattern structure formed on a surface of the semiconductor substrate opposite the surface on which the metallic antenna is formed to condense or disperse electromagnetic waves.

The first pattern structure may be in the shape of a Fresnel lens or Fresnel zone plate so as to function to condense or disperse electromagnetic waves as well as to obstruct surface waves and/or back-scattered waves. In addition, a cross-sectional shape of the first pattern structure may be a repetitive pattern of structures in the shape of rectangles, triangles, inverted triangles, or trapezoids so as to obstruct surface waves and/or back-scattered waves.

FIG. 1 illustrates a PCA according to an exemplary embodiment.

Referring to FIG. 1, the PCA according to an exemplary embodiment includes a semiconductor substrate 10, a metallic antenna 20 formed on a first surface of the semiconductor substrate 10, and a first pattern structure 30 formed on the first surface, the same surface as the surface on which the metallic antenna 20 is formed. The PCA is an example in which the first pattern structure 30 has a repetitive pattern of rectangular cross section 31 so as to obstruct surface waves and/or back-scattered waves. The first surface of the semiconductor substrate may be, for example, an upper surface, as shown in FIG. 1.

The semiconductor substrate 10 may include a III-V-group semiconductor material. For example, the semiconductor substrate 10 may include gallium arsenide (GaAs), gallium phosphide (GaP), or indium phosphide (InP).

The metallic antenna 20 is an electromagnetic wave antenna using a photoconductive effect and may be formed of a metallic material. The metallic antenna 20 may be disposed on the first surface of the semiconductor substrate 10 in a form of patch and may be formed to emit or absorb electromagnetic energy. The metallic antenna 20 may operate by way of dipole or multi-pole electrodes.

The first pattern structure 30 may be patterned on the semiconductor substrate 10 by a lithography process, e.g., an e-beam lithography process, or may be separately produced and assembled with the semiconductor substrate 10.

Figure 2:
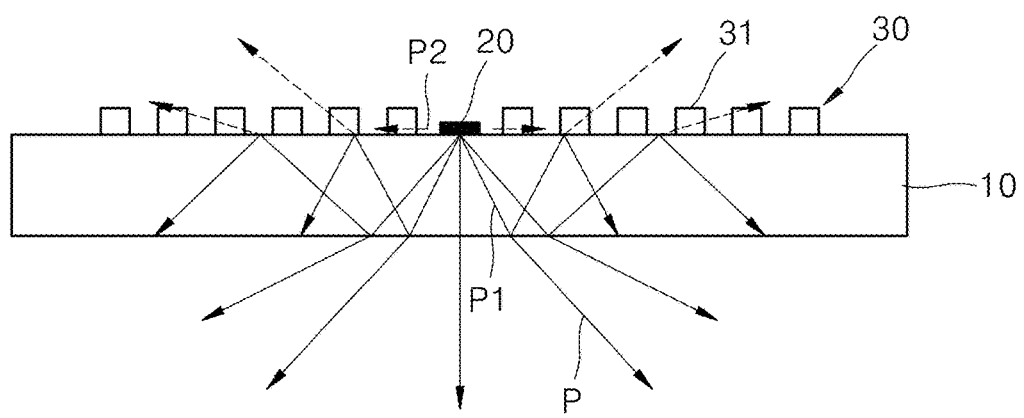
FIG. 2 illustrates propagation paths of electromagnetic waves emitted from a metallic antenna of the PCA of FIG. 1.

As described above, this PCA, having the first pattern structure 30 formed on the same surface as the surface of the semiconductor substrate 10 on which the metallic antenna 20 is disposed, back-scattered waves and/or surface waves may be obstructed as illustrated in FIG. 2.

Referring to FIG. 2, when electromagnetic waves P1 are emitted from the metallic antenna 20, a portion of the emitted electromagnetic waves P1 are reflected from a second surface (e.g. a lower surface) of the semiconductor substrate 10, opposite the first surface, and travel towards the first surface of the semiconductor substrate 10, and the first pattern structure 30 may obstruct the emission of the back-scattered waves through the first surface. In addition, when the metallic antenna 20 emits surface waves P2 along the first surface of the semiconductor substrate 10, the first pattern structure 30 may obstruct the emission of the surface waves P2.

Therefore, as described above, by providing the first pattern structure 30 on the same surface of the substrate (the first surface) as the metallic antenna 20, the emission efficiency of electromagnetic waves P through the opposite surface (the second surface) of the semiconductor substrate 10 may increase.

Figure 3:
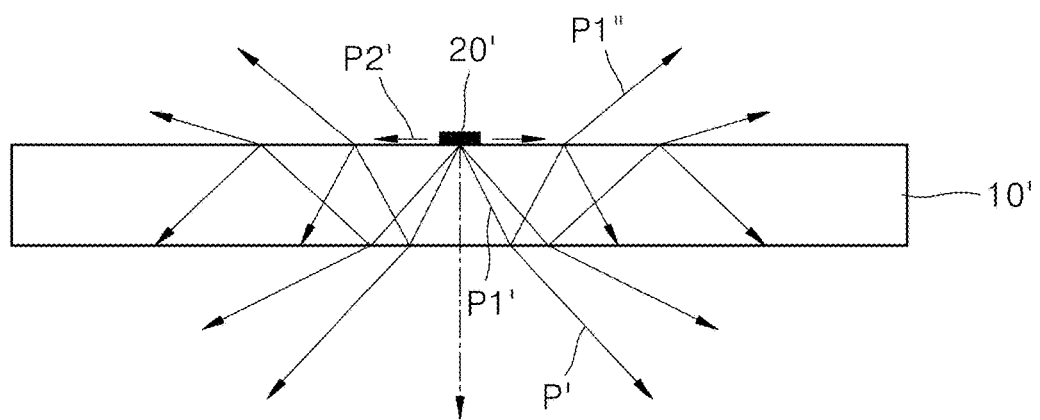
FIG. 3 illustrates propagation paths of electromagnetic waves emitted from a metallic antenna of a PCA having only a metallic antenna on one surface of a semiconductor substrate without a first pattern structure, as a comparative example.

As a comparative example, FIG. 3 shows a case in which only a metallic antenna 20' is formed on a first surface of a semiconductor substrate 10' without a first pattern structure. As shown in FIG. 3, when there is no first pattern structure, a portion of electromagnetic waves P1' generated from the metallic antenna 20' are lost through the first surface of the semiconductor substrate 10' as back-scattered waves, and surface waves P2' are also wasted, and thus, the emission efficiency of electromagnetic waves P' through the second surface, opposite the first surface, of the semiconductor substrate 10' is low.

Figure 4:
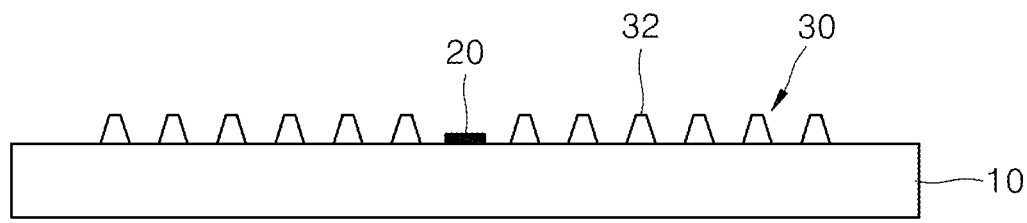
FIGS. 4 to 12 illustrate PCAs according to other exemplary embodiments.
Figure 5:
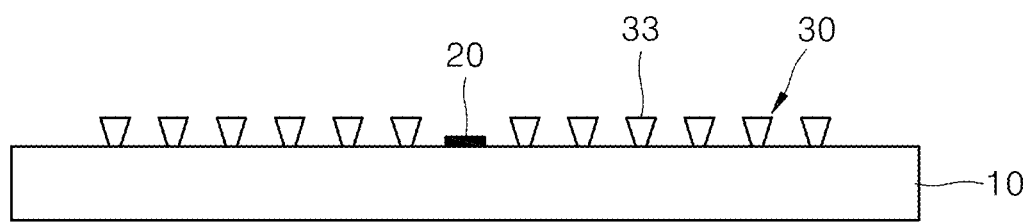

FIGS. 4 and 5 illustrate PCAs according to other exemplary embodiments, wherein FIG. 4 shows an example in which the first pattern structure 30 has a repetitive pattern of trapezoidal cross section 32, and FIG. 5 shows an example in which the first pattern structure 30 has a repetitive pattern of inverted trapezoidal cross section 33.

In the cases of FIGS. 4 and 5, the first pattern structure 30 may obstruct the emission of back-scattered waves through the first surface (e.g., an upper surface) of the semiconductor substrate 10 and surface waves along the first surface (an upper surface) of the semiconductor substrate 10, and thus, the emission efficiency of electromagnetic waves through the second surface (e.g., a lower surface) of the semiconductor substrate 10 may increase.

Figure 6:
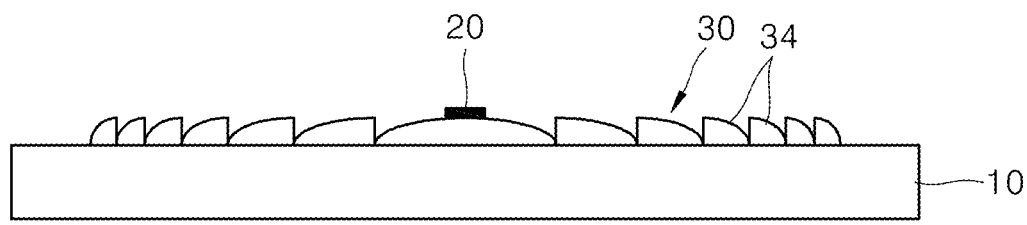

FIG. 6 illustrates a PCA according to another exemplary embodiment, wherein FIG. 6 shows an example in which the first pattern structure 30 has a positive Fresnel lens shape 34.

Figure 7:
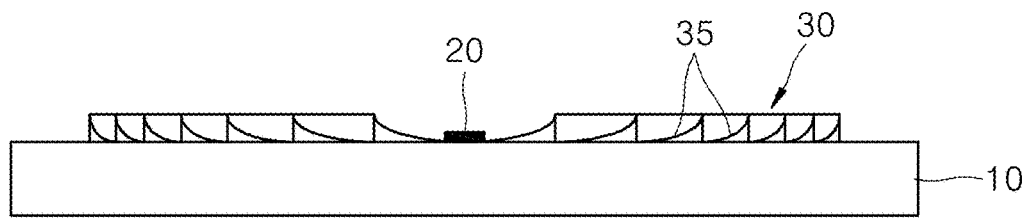
Figure 8:
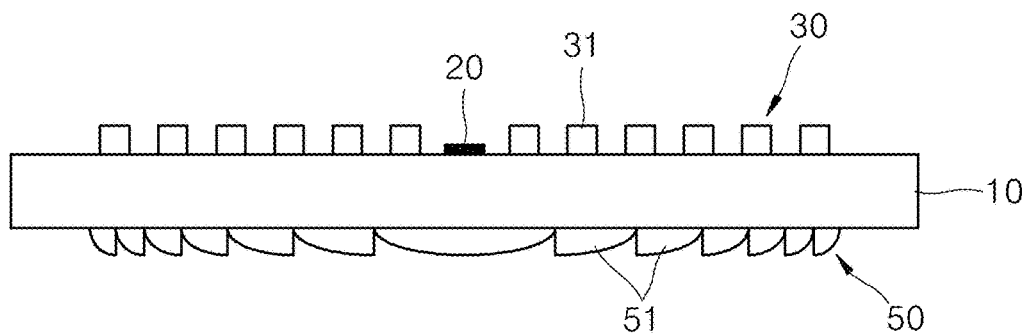
Figure 9:
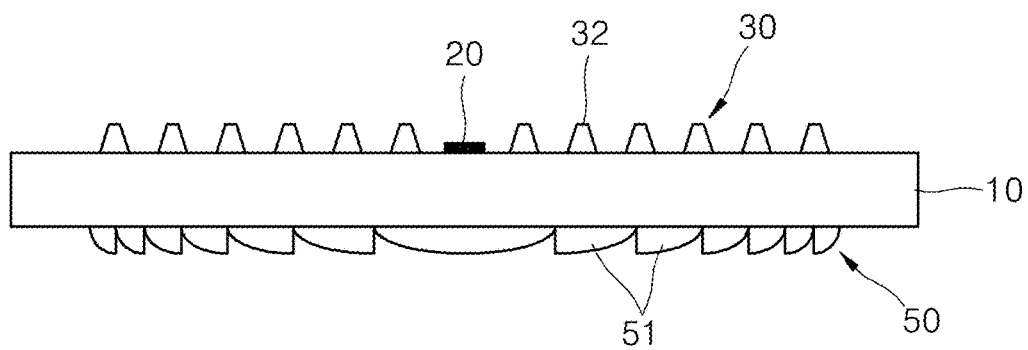
Figure 10:
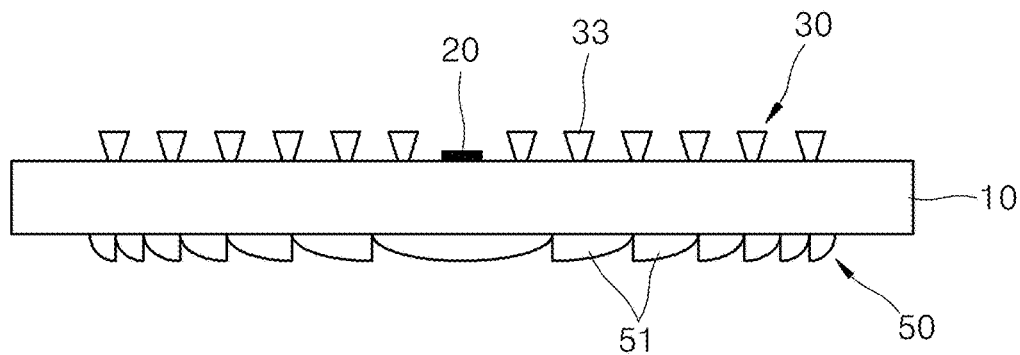
Figure 11:
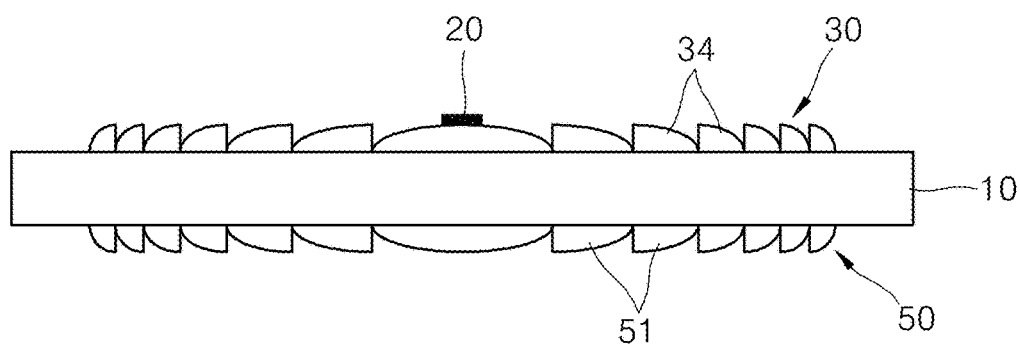
Figure 12:
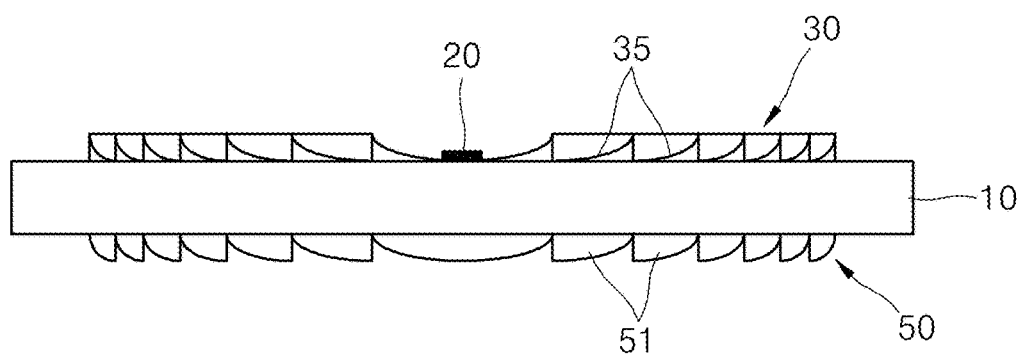

FIG. 7 illustrates a PCA according to another exemplary embodiment, wherein FIG. 7 shows an example in which the first pattern structure 30 has a negative Fresnel lens shape 35.

In the cases of FIGS. 6 and 7, the first pattern structure 30 of a positive or negative Fresnel lens shape 34 or 35 may obstruct back-scattered waves and/or surface waves, and thus, the emission efficiency of electromagnetic waves may increase.

FIGS. 6 and 7 show a case in which the first pattern structure 30 is formed so as to have the Fresnel lens shape 34 or 35, but according to another exemplary embodiment, the first pattern structure 30 may be formed so as to have a Fresnel zone plate shape.

FIGS. 8 to 12 illustrate PCAs having structures corresponding to the PCAs in FIGS. 1 and 4 to 7, respectively, according to other exemplary embodiments, wherein a second pattern structure 50 is formed on the second surface (e.g., a lower surface) of the semiconductor substrate 10.

Referring to FIGS. 8 to 12, PCAs according to exemplary embodiments may include a second pattern structure 50 on the second surface of the semiconductor substrate 10. The second pattern structure 50 may be formed so as to have, for example, a Fresnel lens shape, e.g., a positive Fresnel lens shape.

In this case, electromagnetic waves generated from the metallic antenna 20 may be condensed and collimated by the second pattern structure 50.

FIGS. 8 to 12 show cases in which the second pattern structure 50 is formed so as to have a Fresnel lens shape, but instead, according to one or more exemplary embodiments, the second pattern structure 50 may be formed so as to have a Fresnel zone plate shape.

Hereinafter, electromagnetic wave fields (E-fields) in a general PCA and PCAs according to various exemplary embodiments of will be compared with each other.

Figure 13A:
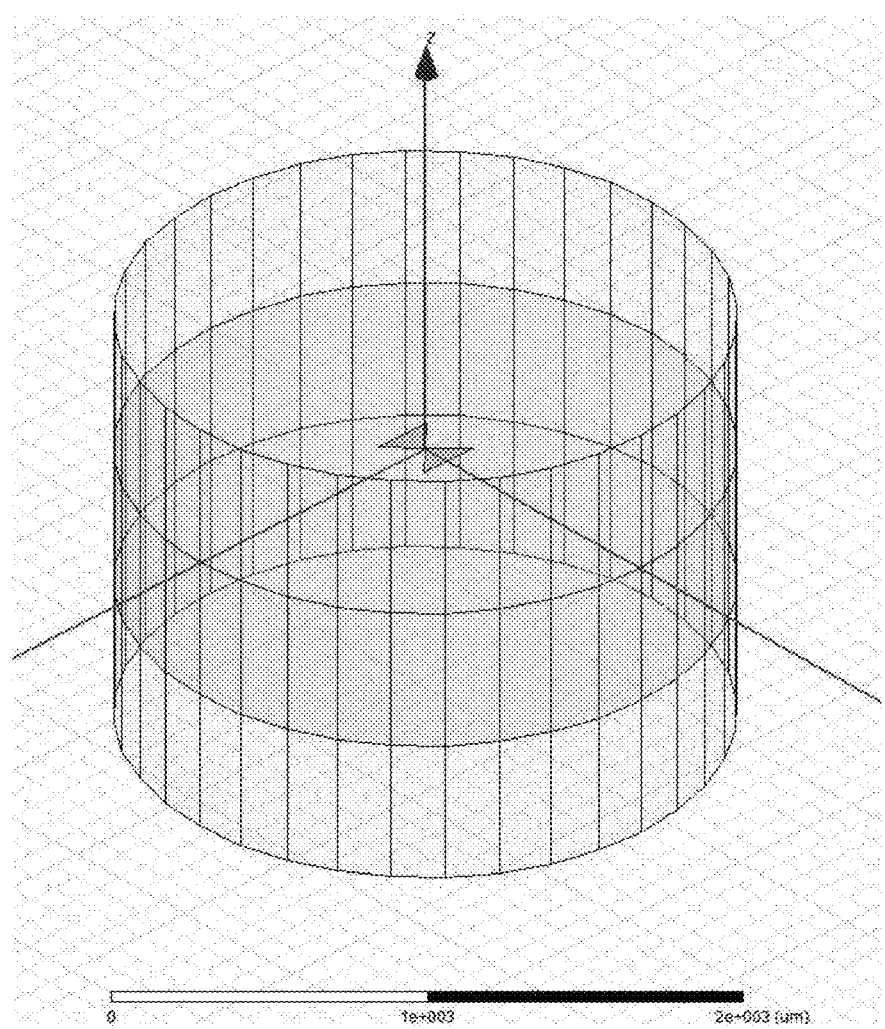
FIG. 13A illustrates a three-dimensional image of a PCA when both first and second surfaces of a semiconductor substrate are flat.
Figure 13B:
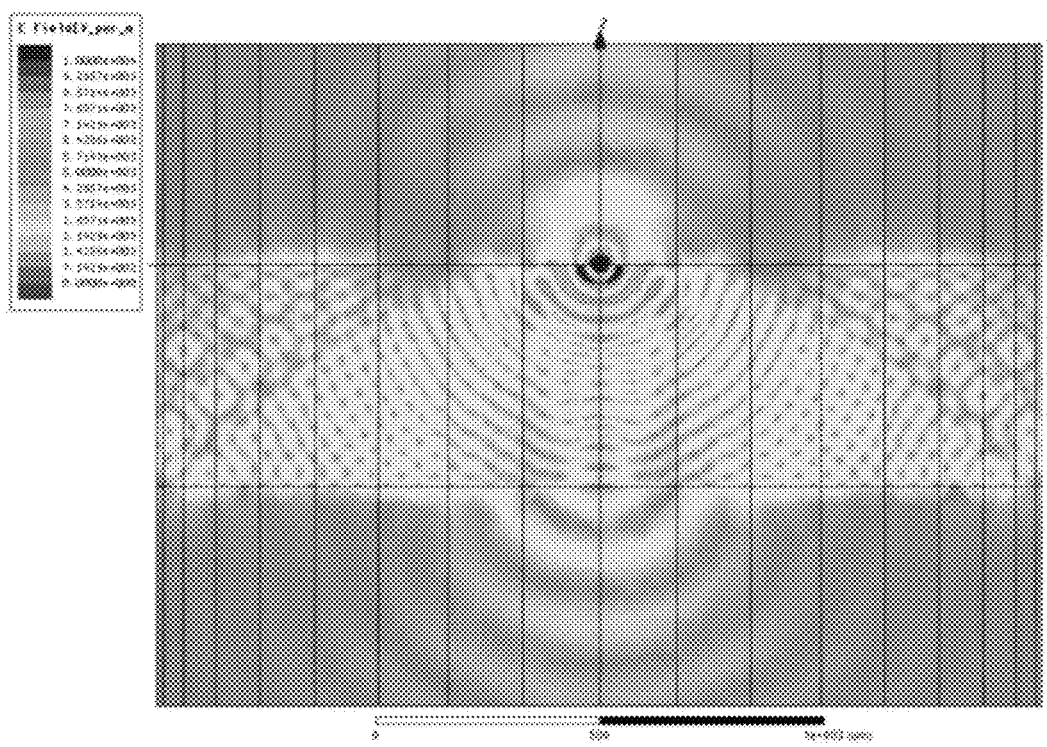
FIG. 13B illustrates an electromagnetic wave field in the structure of FIG. 13A.

FIG. 13A illustrates a three-dimensional image of a PCA when both first and second surfaces (e.g., upper and lower surfaces) of a semiconductor substrate are flat, and FIG. 13B illustrates an E-field in the structure of FIG. 13A.

As shown in FIGS. 13A and 13B, when there is neither a first pattern structure nor a second pattern structure in a PCA, a considerable amount of electromagnetic waves are emitted, even through the surface of the semiconductor substrate on which the metallic antenna is disposed, and are lost, and electromagnetic waves emitted through an opposite surface of the semiconductor substrate are widely diverged.

Figure 14A:
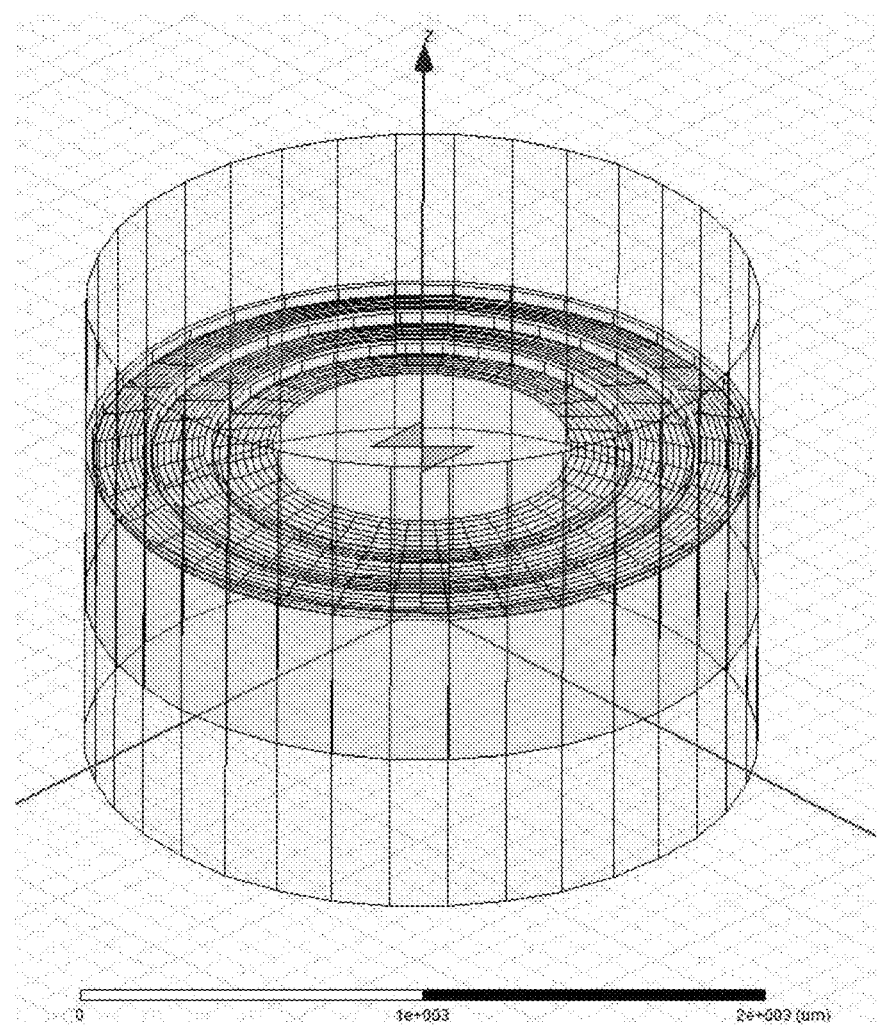
FIG. 14A illustrates a three-dimensional image of a PCA when a first pattern structure having a positive Fresnel lens shape is formed on only a first surface (e.g. an upper surface) of a semiconductor substrate.
Figure 14B:
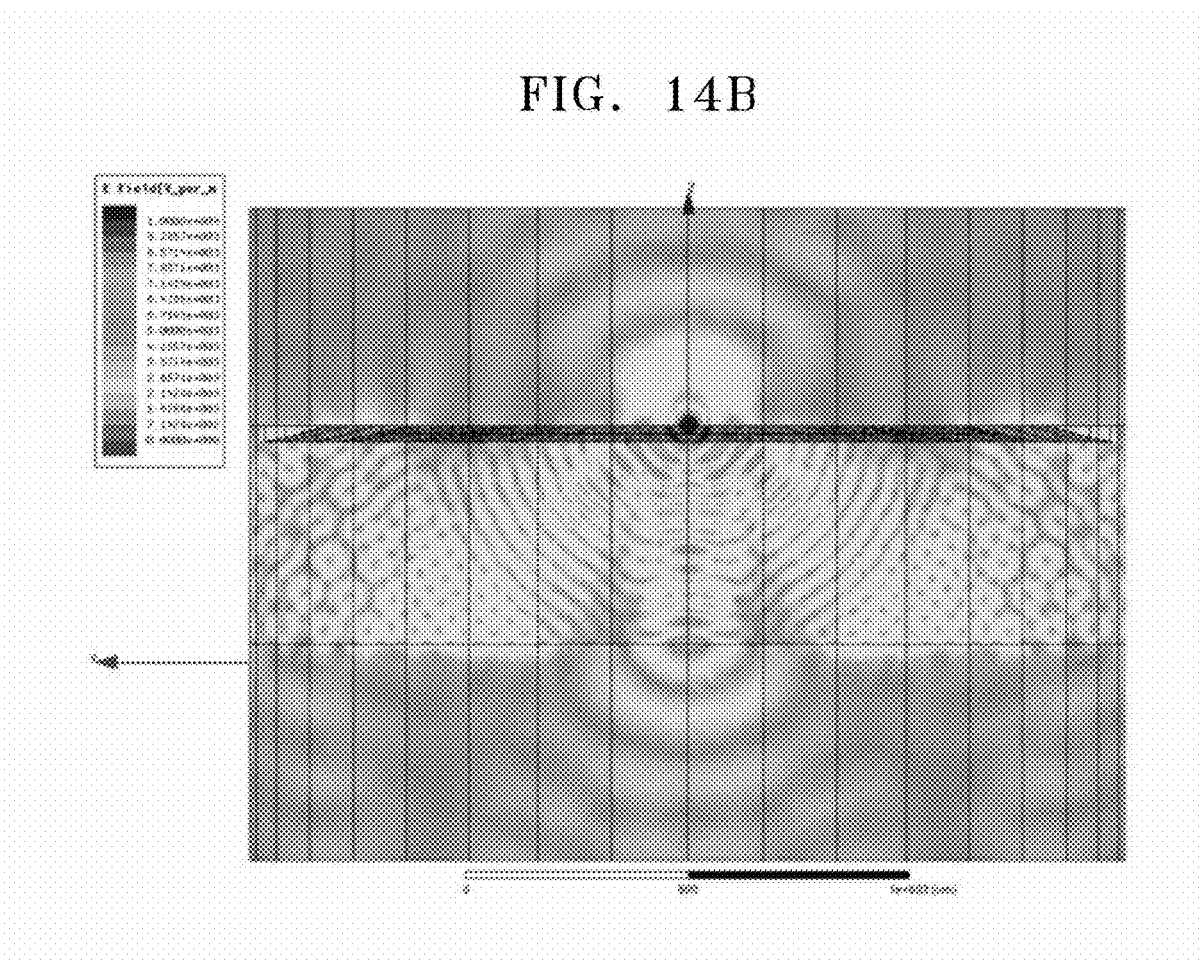
FIG. 14B illustrates an electromagnetic wave field in the structure of FIG. 14A.

FIG. 14A illustrates a three-dimensional image of a PCA when a first pattern structure having a positive Fresnel lens shape is formed on only a first surface (e.g. an upper surface) of a semiconductor substrate, and FIG. 14B illustrates an E-field in the structure of FIG. 14A.

As shown in FIGS. 14A and 14B, when a positive Fresnel lens is used as the first pattern structure in the PCA according to an exemplary embodiment, the emission of electromagnetic waves through the first surface of the semiconductor substrate, on which the metallic antenna is disposed, is obstructed, and a degree of divergence of electromagnetic waves emitted through an opposite, second surface of the semiconductor substrate is also reduced.

Figure 15A:
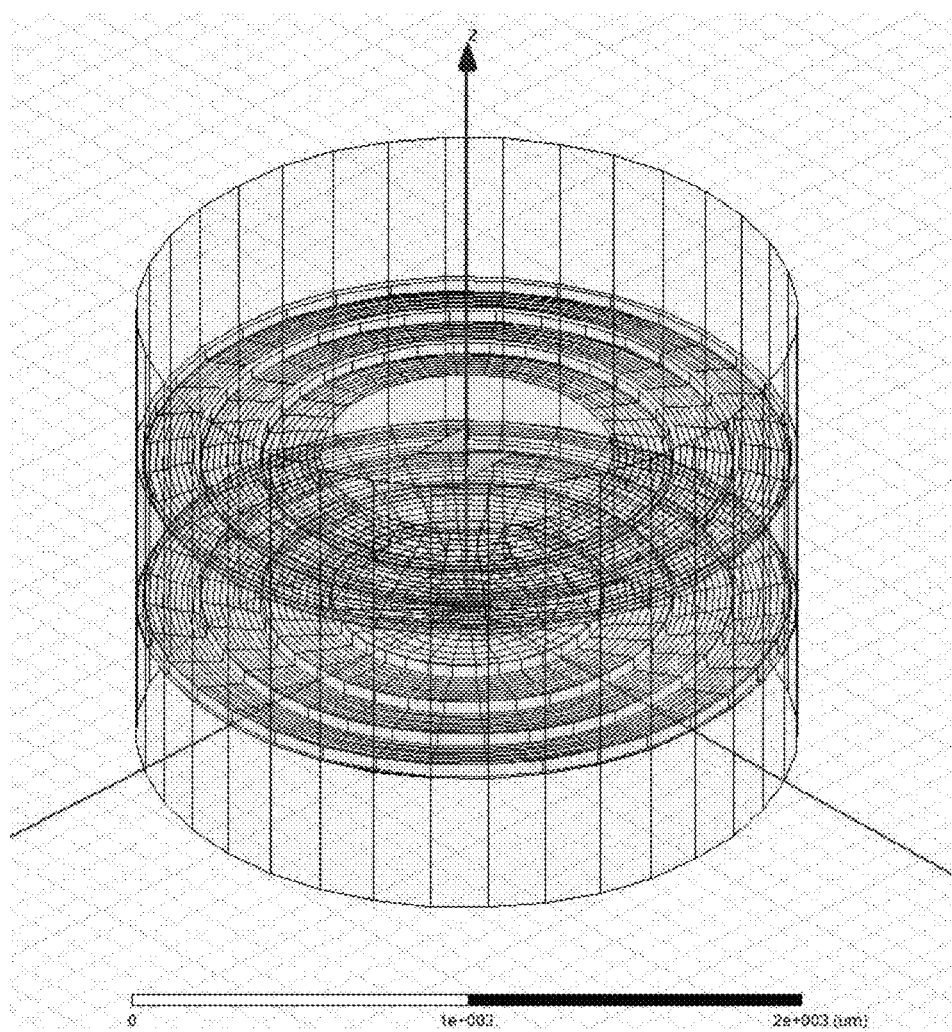
FIG. 15A illustrates a three-dimensional image of a PCA when a first pattern structure having a positive Fresnel lens shape is formed on a first surface (e.g., an upper surface) of a semiconductor substrate and a second pattern structure having a positive Fresnel lens shape is formed on an opposite surface (e.g., a lower surface) of the semiconductor substrate.
Figure 15B:
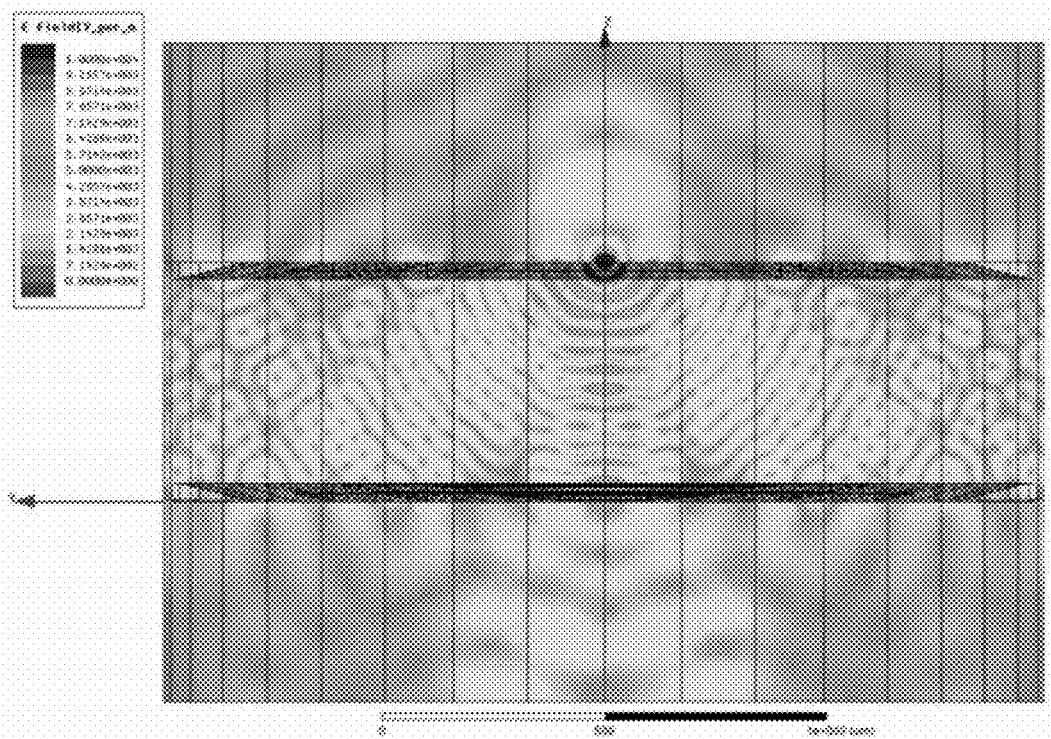
FIG. 15B illustrates an electromagnetic wave field in the structure of FIG. 15A.

FIG. 15A illustrates a three-dimensional image of a PCA in which a first pattern structure having a positive Fresnel lens shape is formed on a first surface (e.g., an upper surface) of a semiconductor substrate and a second pattern structure having a positive Fresnel lens shape is formed on an opposite, second surface (e.g., a lower surface) of the semiconductor substrate, and FIG. 15B illustrates an E-field in the structure of FIG. 15A.

As shown in FIGS. 15A and 15B, when the first pattern structure having the positive Fresnel lens shape and the second pattern structure having the positive Fresnel lens shape are used, the emission of electromagnetic waves through the first surface of the semiconductor substrate, on which the metallic antenna is disposed, is obstructed, and a degree of divergence of electromagnetic waves emitted through the second surface of the semiconductor substrate is more reduced in comparison with the case in which the second pattern structure does not exist as in FIGS. 14A and 14B.

Figure 16A:
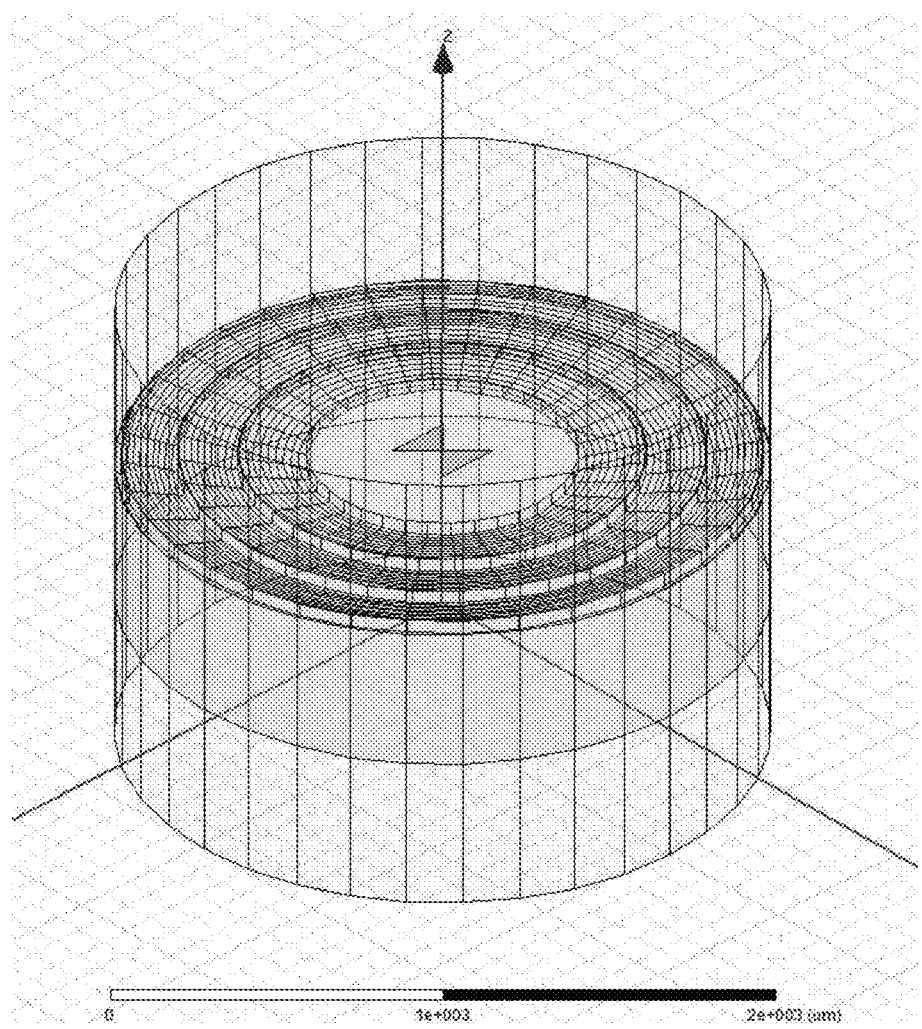
FIG. 16A illustrates a three-dimensional image of a PCA when a first pattern structure having a negative Fresnel lens shape is formed on only a first surface (e.g., an upper surface) of a semiconductor substrate.
Figure 16B:
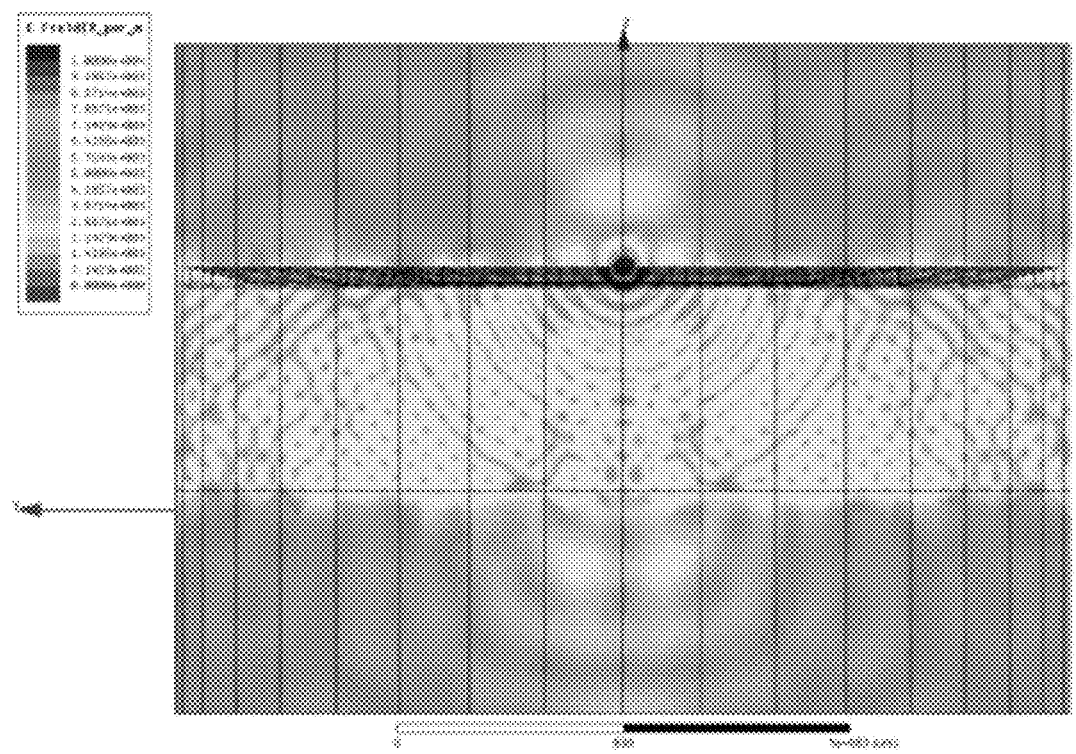
FIG. 16B illustrates an electromagnetic wave field in the structure of FIG. 16A.

FIG. 16A illustrates a three-dimensional image of a PCA in which a first pattern structure having a negative Fresnel lens shape is formed on only a first surface (e.g., upper surface) of a semiconductor substrate, and FIG. 16B illustrates an E-field in the structure of FIG. 16A.

As known from FIGS. 16A and 16B, when a negative Fresnel lens is used as the first pattern structure in the PCA according to an exemplary embodiment, compared with the case in which a positive Fresnel lens is used as the first pattern structure, as in FIGS. 14A and 14B, the emission of electromagnetic waves through the first surface of the semiconductor substrate, on which the metallic antenna is disposed, is significantly obstructed, and a degree of divergence of electromagnetic waves emitted through the second surface of the semiconductor substrate is also significantly reduced.

Figure 17A:
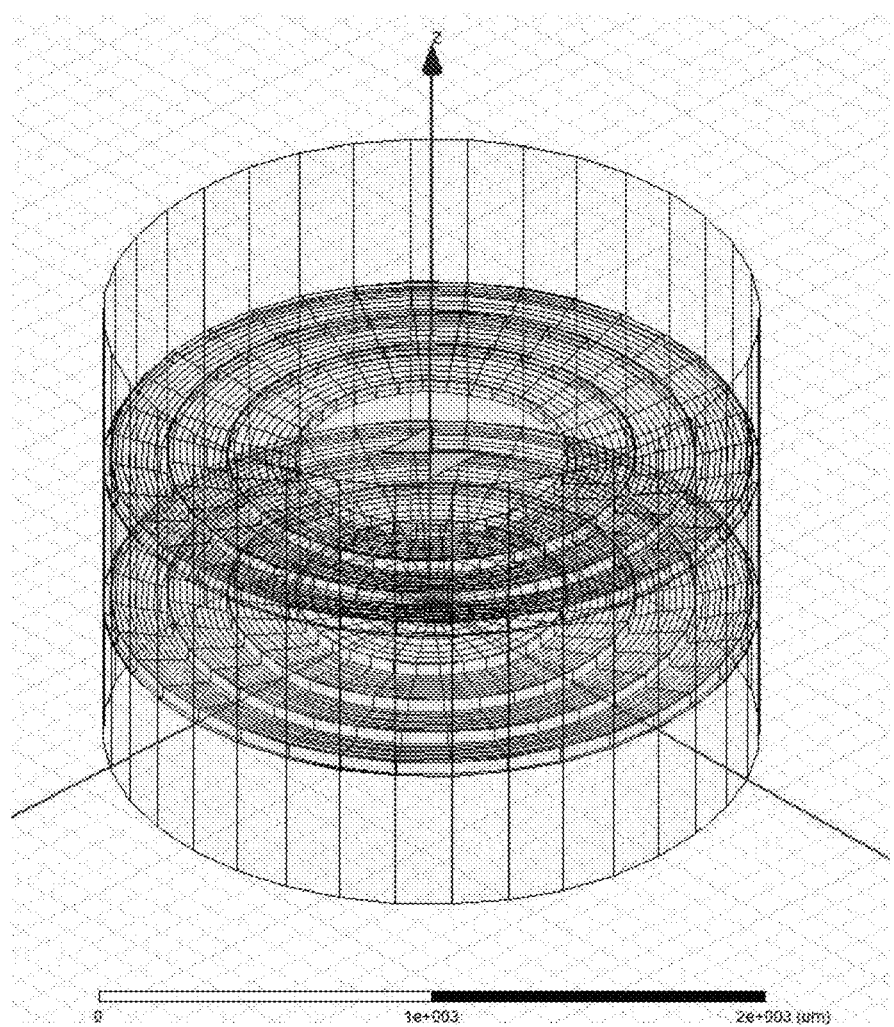
FIG. 17A illustrates a three-dimensional image of a PCA when a first pattern structure having a negative Fresnel lens shape is formed on a first surface (e.g., an upper surface) of a semiconductor substrate and a second pattern structure having a positive Fresnel lens shape is formed on an opposite surface (e.g., a lower surface) of the semiconductor substrate.
Figure 17B:
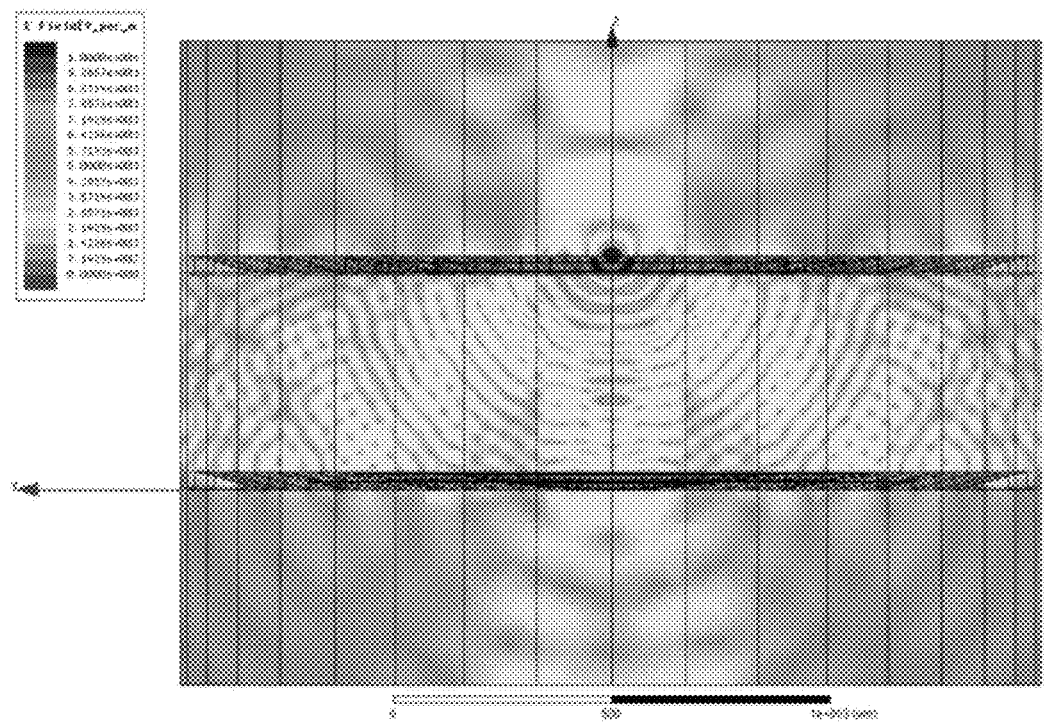
FIG. 17B illustrates an electromagnetic wave field in the structure of FIG. 17A.

FIG. 17A illustrates a three-dimensional image of a PCA when a first pattern structure having a negative Fresnel lens shape is formed on a first surface (e.g., an upper surface) of a semiconductor substrate and a second pattern structure having a positive Fresnel lens shape is formed on the second surface (e.g., a lower surface) of the semiconductor substrate, and FIG. 17B illustrates an E-field in the structure of FIG. 17A.

As shown in FIGS. 17A and 17B, when the first pattern structure having a negative Fresnel lens shape and the second pattern structure having a positive Fresnel lens shape are included, the emission of electromagnetic waves through the first surface of the semiconductor substrate on which the metallic antenna is disposed is significantly obstructed, and a degree of divergence of electromagnetic waves emitted through the second surface of the semiconductor substrate is also significantly reduced.

According to a PCA according to one or more exemplary embodiments, the first pattern structure 30 may obstruct back-scattered waves and/or surface waves, thereby increasing the emission efficiency of electromagnetic waves, and in addition, the second pattern structure 50 may reduce a degree of divergence of emitted electromagnetic waves, thereby collimating the electromagnetic waves.

Figure 18:
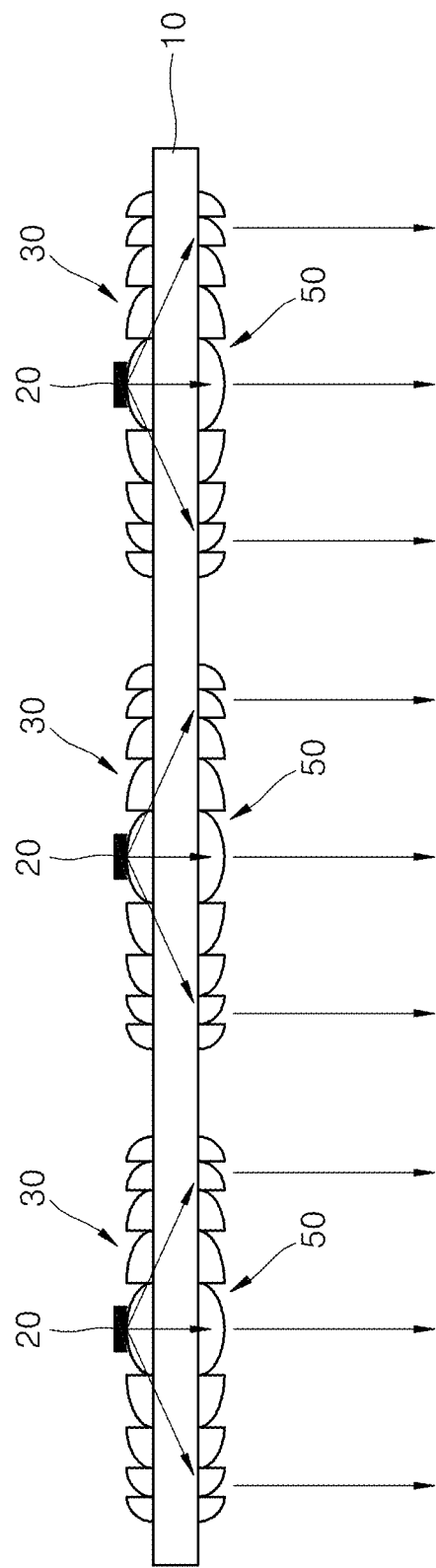
FIG. 18 illustrates a PCA in which an array of groups, each group including a first pattern structure, a metallic antenna, and a second pattern structure, is arranged on a semiconductor substrate.
Figure 19:
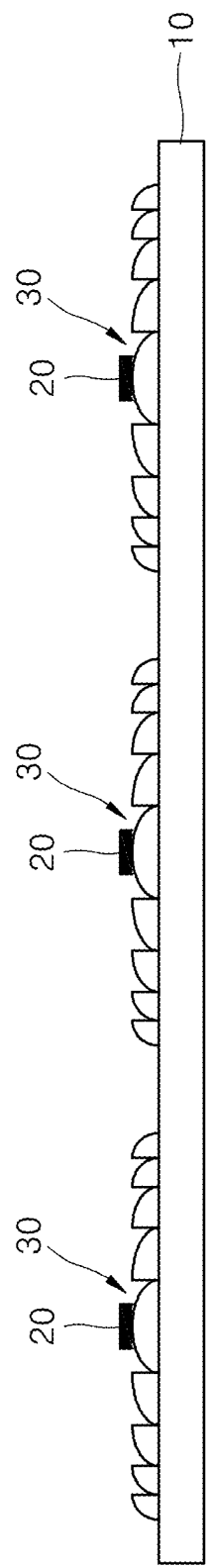
FIG. 19 illustrates a PCA in which an array of groups, each group including a first pattern structure and a metallic antenna, is arranged on a semiconductor substrate.

A PCA according to one or more exemplary embodiments may be arranged in an array form on the semiconductor substrate 10 as shown in FIGS. 18 and 19. FIG. 18 illustrates a PCA in which an array of groups, each group including the first pattern structure 30, the metallic antenna 20, and the second pattern structure 50, is arranged on the semiconductor substrate 10. FIG. 19 illustrates a PCA in which an array of groups, each group including the first pattern structure 30 and the metallic antenna 20, is arranged on the semiconductor substrate 10.

As described above, according to one or more of the above-described exemplary embodiments, a PCA includes a first pattern structure on the same surface of a semiconductor substrate on which a metallic antenna is formed, and thus back-scattered waves and/or surface waves may be obstructed, thereby reducing electromagnetic wave loss and increasing electromagnetic wave emission efficiency.

In addition, a PCA may further include a second pattern structure on opposite surface of the semiconductor substrate, and thus a degree of divergence of emitted electromagnetic waves may be reduced, thereby providing collimated electromagnetic waves.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the present invention as defined by the following claims.

What is claimed is:

1. A photoconductive antenna (PCA) comprising:
 a semiconductor substrate having a first surface and a second surface opposite the first surface;
 a first pattern structure, which is formed as a first Fresnel lens or a first Fresnel zone plate on the first surface, the first pattern structure directing waves incident thereon toward the second surface, the first pattern structure functioning as a negative Fresnel lens configured to obstruct emission of electromagnetic waves through the first surface of the semiconductor substrate;
 a metallic antenna, which is formed on a center area of the first Fresnel lens or the first Fresnel zone plate, and configured to transmit electromagnetic waves toward the second surface; and
 a second pattern structure, which is formed on the second surface of the semiconductor substrate and configured to collimate incident electromagnetic waves having been transmitted through the semiconductor substrate and incident on the second surface, the second pattern structure transmitting the collimated electromagnetic waves to an outside of the second surface, the second pattern structure functioning as a positive Fresnel lens configured to reduce a degree of divergence of electromagnetic waves emitted through the second surface of the semiconductor substrate,
 wherein the second surface passes the incident electromagnetic waves to the second pattern structure.

2. The PCA of claim 1, wherein the first pattern structure is a negative Fresnel lens.

3. The PCA of claim 1, wherein the second pattern structure is one among a second Fresnel lens and a second Fresnel zone plate.

4. The PCA of claim 1, wherein at least one among the first pattern structure and the second pattern structure is patterned on the semiconductor substrate by a lithography process or is produced separately from the semiconductor substrate.

5. The PCA of claim 1, further comprising:
 a first array of first groups disposed on the first surface of the semiconductor substrate; and
 a second array of a plurality of second pattern structures disposed on the second surface of the semiconductor substrate,
 wherein each of the first groups comprises the first pattern structure and the metallic antenna.

6. The PCA of claim 1, wherein the first pattern structure is patterned on the semiconductor substrate by a lithography process or is produced separately from the semiconductor substrate.

7. The PCA of claim 1, further comprising:
 an array of groups disposed on the first surface of the semiconductor substrate, each of the groups comprising the first pattern structure and the metallic antenna.

8. The PCA of claim 1, wherein the semiconductor substrate comprises a III-V-group semiconductor material.

9. The PCA of claim 8, wherein the semiconductor substrate comprises one among gallium arsenide (GaAs), gallium phosphide (GaP), and indium phosphide (InP).

10. The PCA of claim 1, wherein the metallic antenna is an electromagnetic wave antenna comprising one among dipole electrodes and multi-pole electrodes.

11. The PCA of claim 1, wherein
 the electromagnetic waves incident onto the first pattern structure include at least one among surface-waves and back-scattered waves which are reflected by the second surface, among the electromagnetic waves transmitted by the metallic antenna.

12. The PCA of claim 1, wherein the first pattern structure includes the first Fresnel lens that is a negative Fresnel lens configured to diffract the electromagnetic waves incident thereon onto the positive Fresnel lens, which is formed on the second surface and configured to collimate the diffracted electromagnetic waves and transmit the collimated electromagnetic waves to the outside of the second surface, and
 the electromagnetic waves incident onto the negative Fresnel lens of the first pattern structure include at least one among surface-waves and back-scattered waves reflected by the second surface, among the electromagnetic waves transmitted by the metallic antenna.

13. The PCA of claim 1, wherein the first Fresnel lens or at least one element of the first Fresnel zone plate is continuous in a circumferential direction with respect to the metallic antenna.

* * * * *